(12) United States Patent
Watanabe et al.

(10) Patent No.: US 7,750,102 B2
(45) Date of Patent: Jul. 6, 2010

(54) INSULATING FILM FOR SEMICONDUCTOR INTEGRATED CIRCUIT

(75) Inventors: Yasufumi Watanabe, Haibara-gun (JP); Katsuyuki Watanabe, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 176 days.

(21) Appl. No.: 12/026,865

(22) Filed: Feb. 6, 2008

(65) Prior Publication Data

US 2008/0251892 A1 Oct. 16, 2008

(30) Foreign Application Priority Data

Feb. 6, 2007 (JP) ............................. 2007-026547

(51) Int. Cl.
*C08F 38/00* (2006.01)
*C08F 4/80* (2006.01)

(52) U.S. Cl. ...................... 526/285; 526/172; 526/279; 526/282

(58) Field of Classification Search ................. 526/282, 526/285, 172, 279; 438/125
See application file for complete search history.

(56) References Cited

U.S. PATENT DOCUMENTS

| | | | | |
|---|---|---|---|---|
| 3,300,456 | A | * | 1/1967 | Hay ............................ 526/135 |
| 5,017,734 | A | * | 5/1991 | Baum et al. .................... 585/21 |
| 5,019,660 | A | * | 5/1991 | Chapman et al. .............. 585/22 |
| 2005/0025892 | A1 | * | 2/2005 | Satoh et al. .............. 427/385.5 |

FOREIGN PATENT DOCUMENTS

| | | |
|---|---|---|
| JP | 2002-155233 A | 5/2002 |
| JP | 2004-504455 A | 2/2004 |
| WO | 02/08308 A1 | 1/2002 |

OTHER PUBLICATIONS

George A. Olah et al., Single-Step Reductive Isomerization of Unsaturated Polycyclics to C4+n+6H4n+12 Diamondoid Cage Hydrocarbons with Sodium Borohydride/Triflic Acid, J. Org. Chem., (1989), pp. 1450-1451, No. 54.
T. Courtney et al., The Chemistry of Diamantane. Part I. Synthesis and Some Functionalisation Reactions, J.C.S. Perkin I, (1972), pp. 2691-2696.
Tamara M. Gund et al., Diamantane: Pentacyclo[7.3.1.14,12.02,7. 06,11]Tetradecane, Organic Synthesis, pp. 30-34, vol. 53, (1973).

* cited by examiner

*Primary Examiner*—Fred M Teskin
(74) *Attorney, Agent, or Firm*—Sughrue Mion, PLLC

(57) ABSTRACT

The present invention relates to a polymeric compound comprising, as structural units, groups each represented by the following general formula (1); and an insulating film for a semiconductor integrated circuit which comprises the polymeric compound: —$R_1$—C≡C—C≡C—, wherein $R_1$ represents a group having a cage-shaped structure. The insulating film has a high heat resistance, a high mechanical strength and a low dielectric constant. In addition, the insulating film has a high stability of its dielectric constant with the elapse of time. Furthermore, the present invention can provide an interlayer insulating film for electronic devices having a high heat resistance, a high mechanical strength and a low dielectric constant which can be maintained over an extremely long period of time as well as an electronic device whose layer structure is provided with such an insulating film as a constituent thereof.

6 Claims, No Drawings

INSULATING FILM FOR SEMICONDUCTOR INTEGRATED CIRCUIT

TECHNICAL FIELD

The present invention relates to an insulating film for a semiconductor integrated circuit and a polymeric compound suitably used for the preparation of the insulating film.

BACKGROUND ART

In the field of electronic materials, the recent advances of the degree of integration, multi-functionality and performance-improvement of semiconductor devices have resulted in the considerable increases of the circuitry resistance and the condenser capacity observed between distributing wires of the devices and this in turn leads to increases of the electric power consumption and the delay time. In particular, the increase of the delay time may be a principal cause for the reduction of the signal-processing or -transmitting speed of devices and the generation of crosstalk among others, and accordingly, it has been desired for the elimination or reduction of any parasitic resistance and any parasitic capacity in order to reduce the delay time and to thus make the operational speed of a semiconductor device higher. As one of specific means for reducing the parasitic capacity, it has been tried to cover or coat the periphery of the distributing wires with a low dielectric interlayer insulating film.

In addition, the interlayer insulating film should have excellent heat resistance so that the insulating film can withstand the post-processes carried out under severe conditions and encountered when producing a substrate for packaging, such as a thin film-forming step, a tip-connecting step and a pin-attaching or -arranging step; as well as high resistance to chemicals so as to withstand any wet process. Further, there have recently been adopted Cu distributing wires having a low resistance in place of the Al distributing wires currently used. Correspondingly, the CMP (Chemical Mechanical Polishing) technique has in general been selected for the planarization of the distributing wires and insulating films and therefore, the interlayer insulating film should have a high mechanical strength sufficient for the film to withstand this process.

As organic polymeric interlayer insulating films, there have long been known or disclosed, for instance, polybenzoxazoles, polyimides and polyarylenes (ethers), but it has been desired for the development of a material having a lower dielectric constant in order to realize a higher-speed device. However, these materials should further be improved since they suffer from various problems. For instance, if heteroatoms such as oxygen, nitrogen and/or sulfur atoms or aromatic hydrocarbon units are introduced into a polymer molecule like the foregoing materials, the dielectric constant of the polymer increases due to the high molar polarization, it is likewise increased with time because of the moisture absorption of the polymer and the reliability of the resulting electronic devices would in turn be reduced considerably.

On the other hand, the polymers each constituted by saturated hydrocarbons have a low molar polarization as compared with the polymers each constituted by heteroatom-containing units and/or units derived from aromatic hydrocarbons and therefore, the former polymers have such a merit that they show lower dielectric constants. However, the hydrocarbons having high degrees of flexibility such as polyethylenes are insufficient in the heat resistance and accordingly, they cannot be used in the applications as electronic devices.

In this respect, there have been disclosed polymers each comprising, in the molecule, a rigid saturated hydrocarbon having a cage-like structure such as adamantane or di-adamantane and it has also been disclosed that the insulating film derived from such a polymer shows high heat resistance and a low dielectric constant (Japanese Un-Examined Patent Publication 2004-504455). However, it has been known that these films are insufficient in the storage stability with the elapse of time. They accordingly suffer from a problem to be solved such as the increase of the dielectric constant with time.

On the other hand, there has been proposed a low dielectric material having a di-yne structure (Japanese Un-Examined Patent Publication 2002-155233). This is a material for forming an insulating film which is excellent in the mechanical strength, heat resistance and durability, but the initial value of the dielectric constant thereof is rather high on the order of 2.7-2.9 and accordingly, it has been desired for the further reduction of the dielectric constant thereof. Moreover, the film formed from this material suffers from such a problem that the dielectric constant thereof would increase with time and therefore, the material should further be improved in this respect.

DISCLOSURE OF THE INVENTION

Accordingly, it is an object of the present invention to provide a composition which can solve the foregoing problems associated with the conventional techniques and more specifically to provide a composition having a low dielectric constant and excellent mechanical strength suitable for forming an interlayer insulating film used for, for instance, electronic devices.

It is another object of the present invention to provide an insulating film and, in particular, an interlayer insulating film excellent in the storage stability with time, which can be used for, for instance, electronic devices.

It is still another object of the present invention to provide an electronic device whose layer structure comprises the insulating film as a constituent thereof.

The inventors of this invention have conducted various studies to achieve the foregoing objects of the present invention and have found that the foregoing problems associated with the conventional technique can effectively be solved by providing the following technical ideas (i) to (vi):

(i) An insulating film for a semiconductor integrated circuit comprising a polymeric compound having, as structural units, groups each represented by the following general formula (1):

$$-R_1-C\equiv C-C\equiv C- \quad (1)$$

wherein $R_1$ represents a group having a cage-shaped structure.

(ii) The insulating film as set forth in the foregoing item (i), wherein the cage-shaped structure is a member selected from the group consisting of adamantane, bi-adamantane, di-adamantane, tri-adamantane and tetra-adamantane.

(iii) The insulating film as set forth in the foregoing item (i), wherein the polymeric compound is one prepared by oxidation-polymerizing a compound represented by the following general formula (2) in the presence of palladium or copper:

$$R_2-(C\equiv CH)_m \quad (2)$$

wherein $R_2$ represents a group having a valency of m and a cage-shaped structure; and m is an integer ranging from 2 to 19.

(iv) The insulating film as set forth in the foregoing item (iii), wherein the compound represented by the formula (2) is one represented by the following

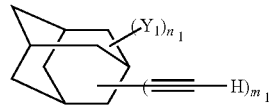
(3)

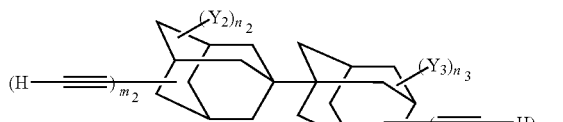
(4)

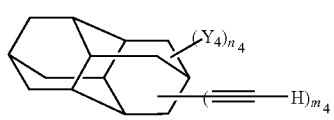
(5)

general formula (3), (4) or (5):

(in the general formula (3), (4) or (5), $Y_1$ to $Y_4$ each independently represent a halogen atom, an alkyl group having 1 to 10 carbon atoms, an aryl group having 6 to 20 carbon atoms, or a silyl group having 0 to 20 carbon atoms; $m_1$ is an integer ranging from 2 to 16, $n_1$ is an integer ranging from 0 to 15, $m_2$ and $m_3$ each independently represent an integer ranging from 1 to 15, $n_2$ and $n_3$ each represent an integer ranging from 0 to 14, $m_4$ is an integer ranging from 2 to 20, and $n_4$ is an integer ranging from 0 to 19).

(v) A polymeric compound comprising, as structural units, groups each represented by the following general formula (1):

$$—R_1—C\equiv C—C\equiv C— \qquad (1)$$

wherein $R_1$ represents a group having a cage-like structure.

(vi) The insulating film as set forth in the foregoing item (v), wherein it can dissolve in cyclohexanone or anisole at a temperature of 25° C. in an amount of not less than 1% by mass.

The present invention permits the formation of an insulating film having a high heat resistance, a high mechanical strength and a low dielectric constant. In addition, the present invention surprisingly permits the formation of an insulating film whose dielectric constant can stably be maintained over an extremely long period of time. Furthermore, the present invention can provide an interlayer insulating film for electronic devices having a high heat resistance, a high mechanical strength and a low dielectric constant which can be maintained over an extremely long period of time as well as an electronic device whose layer structure is provided with such an insulating film as a constituent thereof.

BEST MODE FOR CARRYING OUT THE INVENTION

The insulating film according to the present invention comprises a polymeric compound having, as structural units or repeating units, groups each represented by the following general formula (1):

$$—R_1—C\equiv C—C\equiv C— \qquad (1)$$

wherein $R_1$ represents a group having a cage-shaped structure.

The term "cage-shaped structure" in the foregoing group carrying a cage-shaped structure herein used means a "cage-shaped polycyclic carbon ring structure", the volume thereof is determined by a plurality of rings formed from covalently bonded atoms and the term means such a molecular structure that any point positioned within the cage cannot leave the cage without passing through either of the rings. For instance, adamantane can be considered as a compound having a cage-shaped structure. On the other hand, the ring structure crosslinked through a single bond observed for norbornane (bicyclo[2,2,1]heptane) is not considered to be a compound having such a cage-shaped structure although the structure is a polycyclic carbon ring structure, since the rings of the cyclic compound crosslinked through single bonds never determines the volume of the cyclic structure.

The cage-shaped structure of the polymer used in the present invention may comprise a saturated or unsaturated bond and may likewise include heteroatoms such as those selected from oxygen, nitrogen and sulfur atoms, but the structure is preferably one constituted by a saturated hydrocarbon because of its low dielectric constant.

The cage-shaped structure of the polymer used in the present invention is a member selected from the group consisting of adamantane, bi-adamantane, diamantane, triamantane and tetramantane and dodecahedrane. Among them, preferably used herein include adamantane, bi-adamantane and diamantane and bi-adamantane and diamantane are particularly preferred because of their low dielectric constant.

The group having a cage-shaped structure of the polymer used in the present invention may have at least one substituent and examples of such substituents include atoms or groups selected from the group consisting of halogen atoms (such as fluorine, chlorine, bromine and iodine atoms), linear, branched and cyclic alkyl groups each having 1 to 10 carbon atoms (such as methyl, t-butyl, cyclopentyl, and cyclohexyl groups), alkenyl groups each having 2 to 10 carbon atoms (such as vinyl and propenyl groups), alkynyl groups each having 2 to 10 carbon atoms (such as ethynyl and phenyl ethynyl groups), aryl groups each having 6 to 20 carbon atoms (such as phenyl, 1-naphthyl and 2-naphthyl groups), acyl groups each having 2 to 10 carbon atoms (such as benzoyl group), alkoxycarbonyl groups each having 2 to 10 carbon atoms (such as methoxy-carbonyl; group), carbamoyl groups each having 1 to 10 carbon atoms (such as N,N-diethyl-carbamoyl group), aryloxy groups each having 6 to 20 carbon atoms (such as phenoxy group), arylsulfonyl groups each having 6 to 20 carbon atoms (such as phenyl-sulfonyl group), nitro groups, cyano groups, and organic silyl group (such as triethoxy-silyl, methyl diethoxy-silyl and trivinyl-silyl groups).

The group having a cage-shaped structure used in the present invention preferably has a valency ranging from 2 to 19 and it has more preferably a valency ranging from 2 to 4. In this connection, the group connected to the cage-shaped structure may be a substituent having a valency of not less than 1 or a connecting group having a valency of at least two. The cage-shaped structure preferably has a valency of 3 or 4 from the viewpoint of the improvement of the crosslink density.

The polymeric compound used in the present invention and represented by the foregoing general formula (1) is in general synthesized starting from the compound represented by the following general formula (2):

$$R_2—(C\equiv CH)_m \qquad (2)$$

wherein $R_2$ represents a group having a valency of m and a cage-shaped structure; and m is an integer ranging from 2 to 19.

Furthermore, the polymeric compound is more preferably synthesized starting from the compound represented by the following general formula (3), (4) or (5):

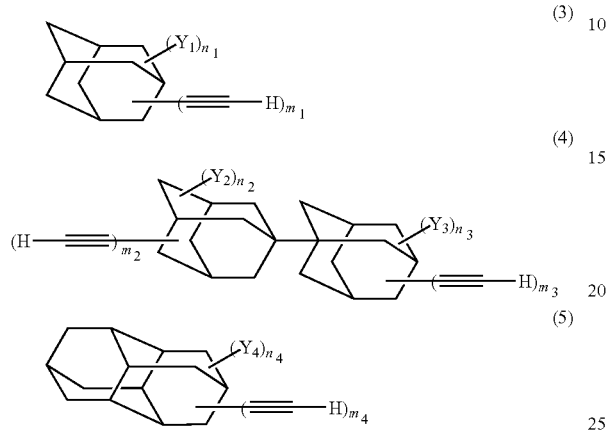

(3)

(4)

(5)

(in the general formula (3), (4) or (5), $Y_1$ to $Y_4$ each independently represent an atom or a group selected from the group consisting of halogen atoms (such as fluorine, chlorine and bromine atoms), alkyl groups (preferably those having 1 to 10 carbon atoms), aryl groups (preferably those having 6 to 20 carbon atoms), or organic silyl group (preferably those having 0 to 20 carbon atoms) and more preferably represent a substituted or unsubstituted alkyl group having 1 to 10 carbon atoms or aryl group having 6 to 20 carbon atoms, with an alkyl group (such as methyl group) being particularly preferred.

The groups $Y_1$ to $Y_4$ may further be substituted and in this case, examples of such substituents may preferably be those listed above in connection with the groups $Y_1$ to $Y_4$.

The suffix $m_1$ represents an integer ranging from 2 to 16 and the suffix $n_1$ represents an integer ranging from 0 to 15. Preferably, $m_1$ represents an integer ranging from 2 to 4 and more preferably 3 or 4. Preferably, $n_1$ represents an integer ranging from 0 to 4, more preferably 0 or 1 and particularly preferably 0.

The suffixes $m_2$ and $m_3$ each independently represent an integer ranging from 1 to 15 and the suffixes $n_2$ and $n_3$ each represent an integer ranging from 0 to 14. Preferably, $m_2$ and $m_3$ represent an integer ranging from 2 to 4 and more preferably 3 or 4. Preferably, $n_2$ and $n_3$ represent an integer ranging from 0 to 4, more preferably 0 or 1 and particularly preferably 0.

The suffix $m_4$ represents an integer ranging from 2 to 20 and the suffix $n_4$ represents an integer ranging from 0 to 19. Preferably, $m_4$ represents an integer ranging from 2 to 4 and more preferably 3 or 4. Preferably, $n_4$ represents an integer ranging from 0 to 4, more preferably 0 or 1 and particularly preferably 0.

The following are specific examples of the monomers used in the synthesis of the polymeric compound represented by the general formula (1) and used in the present invention, but the present invention is by no means limited to these specific examples:

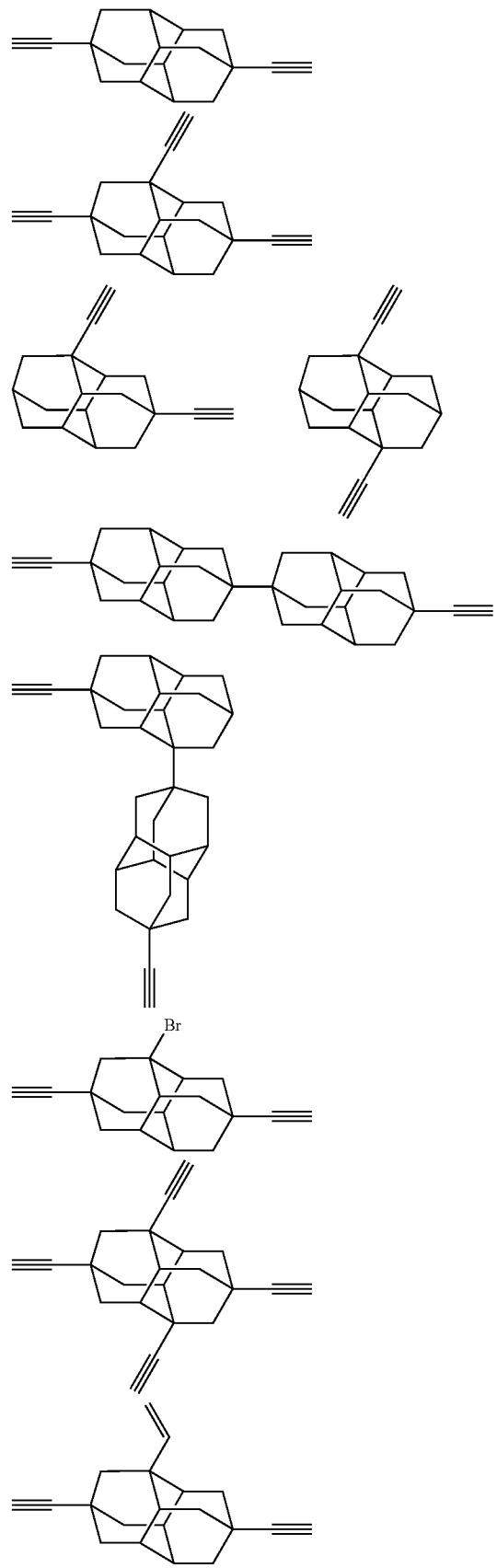

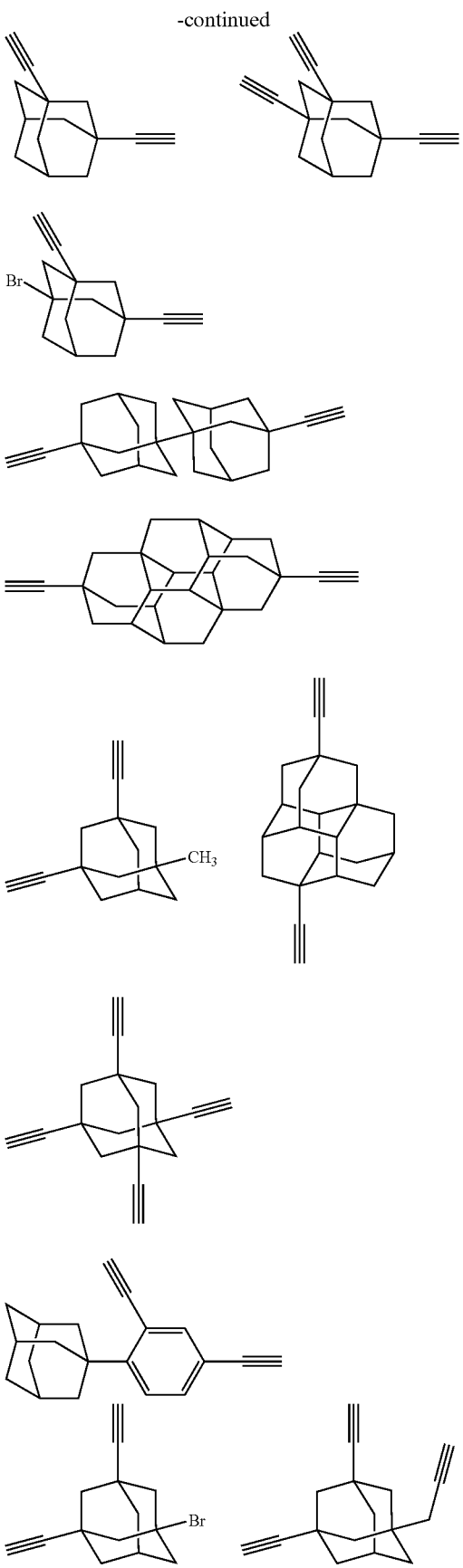

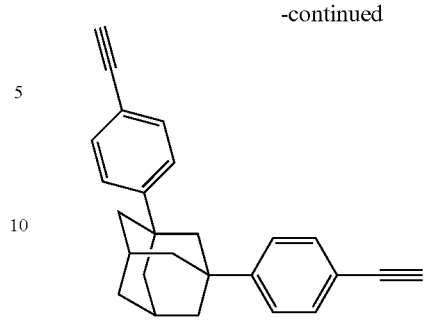

These compounds each having a cage-shaped structure may comprise a heteroatom or an aromatic ring, but it is rather preferred that they are free of any heteroatom or any aromatic ring in view of or for the purpose of forming an insulating film or interlayer insulating film having a low dielectric constant. On other words, the cage-shaped structure-containing compounds are particularly preferably those simply composed of carbon and hydrogen atoms and completely free of any aromatic ring.

The compound having a cage-shaped structure and used in the present invention can be prepared by, for instance, reacting a commercially available diamantane as a starting material with bromine in the presence or absence of an aluminum bromide catalyst to thus introduce bromine atom into the starting material at the predetermined site, then subjecting the product to a Friedel-Crafts reaction with vinyl bromide in the presence of a Lewis acid such as aluminum bromide, aluminum chloride or iron chloride to thus introduce 2,2-dibromoethyl groups into the same and subsequently removing HBr from the resulting product with a strong base to thus convert the groups into ethynyl groups. More specifically, the compound having a cage-shaped structure can be prepared according to the methods as disclosed in, for instance, Macromolecules, 1991, 24:5266-5268; ibid., 1995, 28:5554-5560; and Journal of Organic Chemistry, 1974, 39:2995-3003.

Alternatively, the hydrogen atom of the terminal acetylene group can be converted into an anion by the action of, for instance, butyl lithium and the resulting anion is then reacted with an alkyl halide or a silyl halide to thus introduce an alkyl group or a silyl group into the compound having a cage-shaped structure.

The compounds each having a cage-shaped structure and used in the present invention may be used alone or in any combination of at least two of them.

The polymer having the structure represented by the formula (1) can be prepared by oxidation-polymerizing a compound having at least two terminal ethynyl groups.

In the foregoing oxidative polymerization reaction, a catalyst is used and such catalysts preferably used herein may be, for instance, palladium catalysts or copper catalysts (palladium- or copper-containing catalysts). Specific examples of such catalysts include elemental copper, cuprous chloride, cupric chloride, cuprous bromide, cupric bromide, cuprous iodide, cupric iodide, cuprous sulfate, cupric sulfate, cuprous acetate, cupric acetate, cuprous formate, cupric formate, cuprous oxide, cupric oxide, Cu(I) triflate, Cu(I) methoxide, Cu(II) triflate, Cu(II) methoxide, Cu(II) acetyl-acetonate, Cu(II) di-pivaloyl methane, dichloro-bis-triphenyl phosphine palladium (II), tetrakis-triphenyl phosphine palladium (O), dichloro-bis-triphenyl-cyano palladium (II). Among these, preferably used herein are include cupric chloride, cuprous iodide, and cupric acetate and the catalyst is more preferably cupric acetate. The foregoing copper-containing compounds may be used as such a catalyst in the form of those supported on carriers such as silica or alumina.

In the foregoing oxidative polymerization reaction, it is preferred to use a co-catalyst for the increase of the molecular weight of the resulting polymer. Examples of such co-catalysts usable herein are pyridine, quinoline, pyrrole, piperazine, pyrrolidine, piperidine, picoline, trimethylamine, triethylamine, tri-propylamine, tri-butylamine, monoethanolamine, diethanolamine, dimethyl monoethanolamine, monomethyl diethanolamine, triethanolamine, bipyridine, N,N,N',N'-tetramethyl-ethylenediamine, diazabicyclo-octane, diazabicyclo-nonane, diazabicyclo-undecene, tetramethyl ammonium hydroxide, diethylamine, ammonia, methylamine, ethylamine, propylamine, butylamine, and imidazole. Particularly preferably used herein include, for instance, pyridine, bipyridine, quinoline, and N,N,N',N'-tetramethyl-ethylene-diamine, among others.

The rate of each component used in the foregoing reaction ranges from 0.0001 to 10 moles, preferably 0.005 to 8 moles, more preferably 0.05 to 5 moles and particularly preferably 0.5 to 3 moles based on the total molar amount of the monomer (one mole) for the catalyst. This is because if the amount of the catalyst is not less than 0.0001 mole, the oxidative polymerization reaction would satisfactorily proceed and if it is not more than 10 moles, the resulting polymer product can easily be purified.

In addition, the amount of the co-catalyst to be used ranges from 0.001 to 300 moles, preferably 0.01 to 250 moles, more preferably 0.1 to 230 moles and particularly preferably 1 to 200 moles based on the total molar amount of the monomer (one mole).

The compound having a cage-shaped structure and used in the present invention is preferably polymerized according to the polymerization method which makes use of a solvent such as the solution polymerization, precipitation polymerization, emulsion polymerization, or suspension polymerization technique. In the present invention, the solution polymerization technique is particularly preferably used.

Examples of polymerization solvents used in the oxidative polymerization reaction include chloroform, dichloromethane, 1,2-dichloroethane, chloro-benzene, dichlorobenzene, trichloro-benzene, benzene, toluene, xylene, mesitylene, diethyl-benzene, diethyl ether, tetrahydrofuran, dioxane, diglyme, anisole, acetone, methyl ethyl ketone, methyl isobutyl ketone, 2-heptanone, cyclohexanone, cyclopentane, methyl acetate, ethyl acetate, methyl lactate, ethyl lactate, γ-butyrolactone, γ-butyrolactam, N,N-dimethyl-formamide, N,N-dimethyl-acetamide, N-methyl-2-pyrrolidone, N-methyl-imidazolidinone, pyridine, nitrobenzene, carbon disulfide, nitromethane, dimethylsulfoxide. Among them, preferably used herein are, for instance, tetrahydrofuran, chloroform, dichloromethane, toluene and pyridine because of their excellent ability of solubilizing the resulting polymer. More preferably, tetrahydrofuran, toluene and pyridine are used as the polymerization solvent, with pyridine being particularly preferably used herein.

The concentration of the monomer in the polymerization solvent preferably ranges from 1 to 70% by mass, more preferably 2 to 40% by mass and further preferably 3 to 20% by mass. In this respect, if the monomer concentration is not less than 1% by mass, there is observed such a tendency that the polymerization reaction results in the formation of a polymer having a higher molecular weight.

The polymerization temperature in general ranges from 0 to 150° C., preferably 3 to 130° C., more preferably 5 to 120° C. and further preferably 10 to 100° C. In addition, the polymerization time commonly ranges from 0.05 to 48 hours, preferably 0.1 to 36 hours, more preferably 0.15 to 30 hours and further preferably 0.2 to 24 hours.

In the present invention, to obtain the compound represented by the general formula (1) according to the oxidative polymerization reaction, the reaction should be carried out in the presence of oxygen dissolved in the polymerization solvent. As such a polymerization method carried out in the presence of oxygen, there may be listed, for instance, a method in which the polymerization solution is stirred in the air to thus incorporate oxygen into the polymerization system and a method which comprises the step of blowing either air or oxygen gas or the both in the reaction solution.

The weight average molecular weight (Mw; converted into the molecular weight of the standard polystyrene) of the polymer having structural units (constituent units or repeating units) represented by the general formula (1) is preferably not less than 300 and not more than 200,000, more preferably not less than 700 and not more than 50,000, more preferably not less than 1,000 and not more than 20,000 and particularly preferably not less than 1,500 and not more than 15,000, while taking into consideration the film-forming ability, the ability thereof to be solubilized in a solvent and the filterability of the resulting coating solution.

The composition for forming the insulating film according to the present invention may comprise an organic solvent. The organic solvent usable herein is not restricted to any specific one, but preferably used herein include, for instance, alcoholic solvents such as methanol, ethanol, 2-propanol, 1-butanol, 2-ethoxymethanol, 3-methoxypropanol, and 1-methoxy-2-propanol; ketone type organic solvents such as acetone, acetylacetone, methyl ethyl ketone, methyl isobutyl ketone, 2-pentanone, 3-pentanone, 2-heptanone, 3-heptanone, cyclopentanone and cyclohexanone; ester type organic solvents such as ethyl acetate, propyl acetate, butyl acetate, isobutyl acetate, pentyl acetate, ethyl propionate, propyl propionate, butyl propionate, isobutyl propionate, propylene glycol monomethyl ether acetate, methyl lactate, ethyl lactate, and γ-butyrolactone; ether type organic solvents such as di-isopropyl ether, dibutyl ether, ethyl propyl ether, diphenyl ether, anisole, phenetole, and veratrole; aromatic hydrocarbon type organic solvents such as toluene, mesitylene, ethyl-benzene, diethyl-benzene, propyl-benzene and t-butyl-benzene; heterocyclic organic solvents such as pyridine and imidazole; amide type organic solvents such as N-methyl-pyrrolidinone, and dimethylacetamide. These organic solvents may be used alone or in any combination of at least two of them.

Organic solvents preferably used herein are methanol, 2-propanol, 2-ethoxy-methanol, 3-methoxypropanol, 1-methoxy-2-propanol, acetone, acetylacetone, methyl ethyl ketone, 2-pentanone, 3-pentanone, 2-heptanone, 3-heptanone, cyclopentanone, cyclohexanone, ethyl acetate, propyl acetate, butyl acetate, isobutyl acetate, pentyl acetate, ethyl propionate, propyl propionate, butyl propionate, isobutyl propionate, propylene glycol monomethyl ether acetate, methyl lactate, ethyl lactate, γ-butyro-lactone, di-isopropyl ether, dibutyl ether, ethyl propyl ether, diphenyl ether, anisole, phenetole, veratrole, toluene, mesitylene, ethyl-benzene, diethyl-benzene, propyl-benzene, t-butyl-benzene, pyridine, imidazole, N-methyl-pyrrolidinone, and dimethylacetamide; and organic solvents more preferably used herein are 1-methoxy-2-propanol, acetylacetone, cyclohexanone, 2-heptanone, propylene glycol monomethyl ether acetate, butyl acetate, methyl lactate, ethyl lactate, γ-butyrolactone, diphenyl ether, anisole, toluene, mesitylene, t-butyl-benzene, pyridine, imidazole, N-methyl-pyrrolidinone; those particularly preferably used herein include 1-methoxy-2-propanol, cyclohexanone, 2-heptanone, propylene glycol monomethyl ether acetate, ethyl lactate, γ-butyrolactone, diphenyl ether, toluene, t-butyl-benzene, anisole and pyridine.

The solid content of the composition for forming the insulating film according to the present invention preferably ranges from 1 to 50% by mass, more preferably 1.5 to 20% by mass and particularly preferably 2 to 15% by mass.

In this respect, the term "solid content" used herein corresponds to the total amount of the components which constitute the insulating film formed using the composition.

The amount of the polymer having structural units represented by the general formula (1) present in the insulating film of the present invention is preferably not less than 90% by mass and more preferably not less than 95% by mass.

The polymer having structural units represented by the general formula (1) and prepared according to the present invention preferably has a sufficient solubility in an organic solvent. For instance, the solubility of the polymer in cyclohexane or anisole as determined at a temperature of 25° C. is not less than 1% by mass, preferably not less than 3% by mass, more preferably not less than 5% by mass and particularly preferably not less than 10% by mass.

The insulating film according to the present invention preferably has a low content of metals as impurities. The metal concentration of a composition for forming an insulating film can be determined with a high sensitivity according to the ICP-MS technique and in such case, the content of metals other than the transition metals is preferably not more than 30 ppm, more preferably not more than 3 ppm and particularly preferably not more than 300 ppb. Moreover, the transition metals may serve as catalysts and thus have a high ability of promoting oxidation and the dielectric constant of the film prepared by the present invention may considerably be reduced due to the oxidation reaction possibly encountered during the prebake and/or thermal cure processes. Accordingly, the composition preferably has a lower content of the transition metals and the content thereof in the composition is preferably not more than 10 ppm, more preferably not more than 1 ppm and particularly preferably not more than 100 ppb.

The metal concentration of an insulating film can likewise be estimated according to the total reflection of X-ray fluorescence analysis method. When using a W-beam as an X-ray source, there can be detected metal elements such as K, Ca, Ti, Cr, Mn, Fe, Co, Ni, Cu, Zn and Pd and the content of each metal element present in the insulating film is preferably not more than $100 \times 10^{10}$ atoms/cm$_2$, more preferably not more than $50 \times 10^{10}$ atoms/cm$_2$, and particularly preferably not more than $10 \times 10^{10}$ atoms/cm$_2$. In addition, this method also permits the detection of Br as a halogen atom and the residual amount thereof is preferably not more than $10,000 \times 10^{10}$ atoms/cm$_2$, more preferably not more than $1,000 \times 10^{10}$ atoms/cm$_2$, and particularly preferably not more than $400 \times 10^{10}$ atoms/cm$_2$. Moreover, this method likewise permits the detection of Cl as another halogen atom and the residual amount thereof is preferably not more than $100 \times 10^{10}$ atoms/cm$_2$, more preferably not more than $50 \times 10^{10}$ atoms/cm$_2$, and particularly preferably not more than $10 \times 10^{10}$ atoms/cm$_2$, for the purpose of preventing the occurrence of any damage of, for instance, the CVD device and the etching device.

Furthermore, the insulating film of the present invention may comprise additives such as a radical-generating agent, colloidal silica, a surfactant, and a silane-coupling agent (or an adhesion-promoting agent) in amounts which never adversely affect the desired properties of the film (such as heat resistance, dielectric constant, mechanical strength, coating properties and adhesiveness).

The "radical-generating agent" used herein means a compound capable of generating radicals of carbon, oxygen and/or nitrogen atoms by the irradiation thereof with heat or optical energies and it can serve to promote the curing reaction of the insulating film.

Any colloidal silica material may be used in the present invention. For instance, it may be a dispersion obtained by dispersing highly pure silicic acid anhydride in a hydrophilic organic solvent or water, the average particle size of the colloidal silica particles usually ranges from 5 to 30 nm and preferably 10 to 20 nm. Further, the solid content of the colloidal silica usable herein ranges from 5 to 40% by mass.

Any surfactant may be incorporated into the composition for forming an insulating film according to the present invention inasmuch as it can improve the coating properties and the film-forming properties thereof, but those usable herein include, for instance, nonionic surfactants, anionic surfactants and cationic surfactants, as well as silicone-type surfactants, fluorine atom-containing surfactants, polyalkylene oxide type surfactants, and acrylic surfactants. These surfactants may be used alone or in any combination of at least two of them, in the present invention. As such surfactants, preferably used herein include silicone-containing surfactants, nonionic surfactants, fluorine atom-containing surfactants, and acrylic surfactants, more preferably used herein include silicone-type surfactants and nonionic surfactants, with silicone-containing surfactants being particularly preferred.

The amount of the surfactant to be incorporated into the composition of the present invention is preferably not less than 0.01% by mass and not more than 1% by mass, more preferably not less than 0.05% by mass and not more than 0.70% by mass and further preferably not less than 0.1% by mass and not more than 0.5% by mass on the basis of the total amount of the composition for forming the film.

The silicone-type surfactant usable in the present invention is a surfactant comprising at least one Si atom in the molecule. In other words, it is a known Si atom-containing compound which possesses surface activity and the surfactant of this type preferably comprises a structure containing an alkylene oxide moiety and a dimethyl-siloxane moiety. In particular, the silicone-type surfactant further preferably has a structure represented by the following chemical formula:

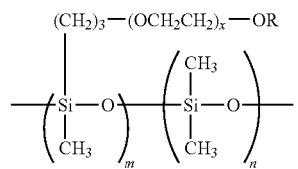

In the foregoing general formula, R represents a hydrogen atom or an alkyl group (preferably one having 1 to 5 carbon atoms); x represents an integer ranging from 1 to 20; m and n each independently represent an integer ranging from 2 to 100. In case where there are a plurality of substituents R, they may be the same or different.

Specific examples of the silicone-type surfactants usable in the present invention include BYK306, BYK307 (available from BIG Chemie Company), SH7PA, SH21PA, SH28PA, SH30PA (available from Toray-Dow Corning-Silicone Company) and Troysol S366 (available from Troy Chemical Company).

The nonionic surfactant usable in the present invention may be any known one. Specific examples thereof include polyoxyethylene alkyl ethers, polyoxyethylene aryl ethers, polyoxyethylene dialkyl esters, sorbitan fatty acid esters, fatty acid-modified polyoxyethylenes and polyoxyethylene-polyoxypropylene block copolymers.

The fluorine atom-containing surfactant usable in the present invention may be any known one. Specific examples thereof include perfluoro-octyl polyethylene oxide, perfluoro-decyl polyethylene oxide and perfluoro-dodecyl polyethylene oxide.

The acrylic surfactant usable in the present invention may be any known one. Specific examples thereof include copolymers derived from (meth)acrylic acids.

In the present invention, any known silane-coupling agent (or an adhesion-promoting agent) may be used for the improvement of the adhesion to a substrate. Specific examples thereof are 3-glycidyloxy-propyl trimethoxy-silane, 3-aminoglycidyl-oxypropyl triethoxy-silane, 3-methacryloxypropyl trimethoxy-silane, 3-glycidyloxy-propyl methyl-dimethoxy silane, 1-methacryloxypropyl methoxy-dimethoxy silane, 3-aminopropyl trimethoxy silane, 3-aminopropyl triethoxy silane, 2-aminopropyl trimethoxy silane, 2-aminopropyl triethoxy silane, N-(2-aminoethyl)-3-aminopropyl trimethoxy silane, N-(2-aminoethyl)-3-aminopropyl methyl-dimethoxy silane, N-(2-aminoethyl)-3-aminopropyl dimethyl-methoxy silane, N-(2-aminoethyl)-3-amino-propyl trimethoxy silane, 3-ureidopropyl trimethoxy silane, 3-ureidopropyl triethoxy silane, N-ethoxycarbonyl-3-aminopropyl trimethoxy silane, N-ethoxycarbonyl-3-aminopropyl triethoxy silane, N-triethoxy-silylpropyl triethylene triamine, 10-tri-methoxysilyl-1,4,7-triazadecane, 10-triethoxysilyl-1,4,7-triazadecane, 9-trimethoxy-silyl-3,6-diazanonyl acetate, 9-triethoxysilyl-3,6-diazanonyl acetate, N-benzyl-3-aminopropyl trimethoxy silane, N-benzyl-3-aminopropyl triethoxy silane, N-phenyl-3-amino-propyl trimethoxy silane, N-phenyl-3-aminopropyl triethoxy silane, N-bis(oxy-ethylene)-3-aminopropyl trimethoxy silane, N-bis(oxy-ethylene)-3-aminopropyl tri-ethoxy silane, trimethoxy-silyl benzoate, γ-methacryloxy-propyl trimethoxy silane, vinyl tri-acetoxy silane, vinyl trimethoxy silane, γ-isocyanato-propyl triethoxy silane, γ-glycidoxy-propyl trimethoxy silane, β-(3,4-epoxy-cyclohexyl)ethyl trimethoxy silane, trimethoxy vinyl silane, γ-aminopropyl triethoxy silane, aluminum monoethyl acetoacetate diisopropylate, vinyl-tris(2-methoxyethoxy)silane, 3-chloropropylmethyl dimethoxy silane, 3-chloropropyl trimethoxy silane, 3-mercaptopropyl trimethoxy silane, trimethyl chlorosilane, dimethyl-vinyl chlorosilane, methyl-diphenyl chloro-silane, chloromethyl dimethyl chlorosilane, trimethyl methoxy silane, dimethyl diethoxy silane, methyl dimethoxy silane, dimethyl-vinyl ethoxy silane, diphenyl dimethoxy silane, phenyl triethoxy silane, hexamethyl disilazane, N,N'-bis(trimethyl-silyl)urea, dimethyl trimethyl-silyl amine, trimethyl-silyl imidazole, vinyl-trichloro-silane, benzotriazole, benzimidazole, indazole, imidazole, 2-mercapto-benzimidazole, 2-mercapto-benzothiazole, 2-mercapto-benzoxazole, urazol, thiouracil, mercapto-imidazole, mercapto-pyrimidine, 1,1-dimethylurea, 1,3-dimethylurea, and thiourea compounds. Functional silane-coupling agents are preferred as the adhesion-promoting agent. In the present invention, these silane-coupling agents may be used alone or in any combination of at least two of them. The amount of the silane-coupling agent preferably used is not more than 10 parts by mass, more preferably 0.03 to 7 parts by mass and in particular 0.05 to 5 parts by mass per 100 parts by mass of the total solid content of the composition.

The insulating film of the present invention may further comprise a hole-forming factor in such an amount which never adversely affects the mechanical strength of the film to thus make the film porous and to thereby reduce the dielectric constant thereof. The size of the holes to be formed is at highest 10 nm, preferably at highest 5 nm and particularly preferably at highest 1 nm.

Such an additive serving as a hole-forming agent and as a hole-forming factor is not restricted to any specific one, but preferably used herein are non-metallic compounds and they should simultaneously satisfy the requirements for the solubility in a solvent used in the coating solution for forming such an insulating film and for the compatibility with the polymer used in the composition of the present invention. In addition, the boiling point or decomposition temperature of the hole-forming agent preferably ranges from 100 to 500° C., more preferably 200 to 450° C. and particularly preferably 250 to 400° C. The molecular weight thereof preferably ranges from 200 to 50,000, more preferably 300 to 10,000 and particularly preferably 400 to 5,000. The amount thereof to be added preferably ranges from 0.5 to 75%, more preferably 0.5 to 55% and particularly preferably 1 to 40% as expressed in the unit of "% by mass" on the basis of the total weight of the film-forming polymer. Alternatively, the polymer may comprise, in the molecule, decomposable groups as the foregoing hole-forming factor and the decomposition temperature of the groups preferably ranges from 100 to 500° C., more preferably 200 to 450° C. and particularly preferably 250 to 400° C. The content of such decomposable groups in the polymer molecule preferably ranges from 0.5 to 75% by mole, more preferably 0.5 to 55% by mole and particularly preferably 1 to 40% by mole with respect to the total molar amount of the monomer units present in the film-forming polymer.

The film of the present invention can be formed by applying a film-forming composition onto the surface of a substrate according to any known method such as the spin coating technique, the roller coating technique, the dip coating technique or the scan coating technique and then removing the solvent through, for instance, a heat-treatment.

The heating step for the removal of the solvent is preferably carried out at a temperature ranging from 100 to 250° C. for 1 to 5 minutes. The method for the application of the coating solution onto a substrate is preferably the spin coating technique and the scan coating technique, with the spin coating technique being particularly preferred. In the spin coating step, any commercially available apparatuses can be used herein. Examples of such apparatuses preferably used herein are Clean Truck Series (available from Tokyo Electron Co., Ltd.); D-Spin Series (available from Dao-Nippon Screen Co., Ltd.); and SS Series or CS Series (available from Tokyo Ohka Kogyo Co, Ltd.). The spin coating operation can be carried out at any rotational speed, but the preferred rotational speed is about 1,300 rpm for a silicon substrate having a diameter of 300 mm while taking into consideration the uniformity of the film surface.

Moreover, the method for discharging the solution of the composition may be either a dynamic discharge method in which a solution containing a film-forming composition is discharged on the surface of a rotated substrate or a static discharge method in which a solution containing a film-forming composition is discharged on the surface of a substrate at rest, but preferably used herein is the dynamic discharge method from the viewpoint of uniformity of the surface of the resulting film. Moreover, it is also possible to use such a method that only the principal solvent is first preliminarily discharged onto the substrate surface to thus form a liquid film thereon and then the composition is discharged on the liquid film, to save or control the amount of the film-forming composition to be consumed. The time required for the spin coating step is not particularly restricted, but it is preferably not more than 180 seconds from the viewpoint of the throughput. Moreover, it is also preferred to any treatment for eliminating the film on the edge portion of the substrate (an edge-rinsing and/or back-rinsing treatment) for the purpose of ensuring the smooth conveyance of the substrates. The method for the foregoing heat-treatment is not restricted to any specific one, but it may be any currently used one such as the hot plate-heating method; the heating method which makes use of a furnace; and the light-irradiation heating method using a xenon lamp according to, for instance, RTP (Rapid Thermal Processor). Among them, preferably used herein are the hot plate-heating method and the heating method which makes use of a furnace. The hot plate preferably used herein may be any commercially available one and specific examples thereof preferably used herein include Clean Truck Series (available from Tokyo Electron Co., Ltd.); D-Spin Series (available from Dao-Nippon Screen Co., Ltd.); and SS Series or CS Series (available from Tokyo Ohka Kogyo Co., Ltd.). Examples of the foregoing furnaces preferably used include α-Series (available from Tokyo Electron Co., Ltd.).

The polymer used in the present invention is particularly preferably cured (or fired) through a heat-treatment after the application thereof on the surface of a substrate. In this connection, the curing can be carried out while making use of, for instance, the polymerization reaction of the carbon-carbon triple bonds remaining in the polymer, which takes place during the post-heating step. The post-heating step is carried out at a temperature preferably ranging from 100 to 450° C., more preferably 200 to 420° C. and particularly preferably 350 to 400° C., for a period of time preferably ranging from one minute to 2 hours, more preferably 10 minutes to 1.5 hours and particularly preferably 30 minutes to one hour. The post-heating step can be carried out in several stages. Moreover, the post-heating step is particularly preferably carried out in a nitrogen gas atmosphere in order to prevent the occurrence of any thermal oxidation due to the presence of oxygen gas.

In the present invention, the coated film may likewise be cured (or fired) by inducing the polymerization reaction of the carbon-carbon triple bonds remaining in the film-forming polymer through the irradiation thereof with a high energy beam in place of the foregoing heat-treatment. The term "high energy beam" herein used means, for instance, an electron beam, ultraviolet light rays and X-rays, but the present invention is not restricted to these specific methods at all.

When using an electron beam as the high energy beam, the energy thereof is preferably not more than 50 keV, more preferably not more than 30 keV and particularly preferably not more than 20 keV. In this respect, the total dose of the electron beam is preferably not more than 5 $\mu C/cm_2$, more preferably not more than 2 $\mu C/cm_2$, and particularly preferably not more than 1 $\mu C/cm_2$. The temperature of the substrate upon the irradiation thereof preferably ranges from 0 to 450° C., more preferably 0 to 400° C., and particularly preferably 0 to 350° C. The pressure during the irradiation step preferably ranges from 0 to 133 kPa, more preferably 0 to 60 kPa and particularly preferably 0 to 20 kPa. The substrate is preferably surrounded by an inert gas atmosphere of, for instance, an Ar, He or nitrogen gas for the purpose of preventing the occurrence of any oxidation of the film-forming polymer. Alternatively, gases such as oxygen, hydrocarbon and/or ammonia gases may be added to the atmosphere surrounding the substrate for the purpose of any reaction with the plasma generated through the interaction with electron beam, electromagnetic waves, and/or chemical species. The electron beam-irradiation may be carried out in a plurality of stages and in this case, the conditions for these electron beam-irradiation stages are not necessarily the same and may be different from stage to stage.

Ultraviolet light rays may be used as the high energy beam. When using ultraviolet rays, the wavelength thereof preferably falls within the range of from 190 to 400 nm, and the output thereof preferably ranges from 0.1 to 2000 mW/cm$_2$ as determined just above the substrate. The temperature of the substrate upon the irradiation with ultraviolet rays preferably ranges from 250 to 450° C., more preferably 250 to 400° C., and particularly preferably 250 to 350° C.

When the film of the present invention is used as an interlayer insulating film for semiconductor devices, the film may be provided with, in the interconnecting structure, a barrier layer on the sides of the distributing wires for the prevention of any metal migration and further, the film of the present invention may likewise provided with a capping layer for preventing any peeling off of the film during the CMP step and an interlayer adhesive layer as well as an etching stopper layer or the like, as the bottom layer(s) of the film. In addition, the interlayer insulating film may optionally be divided into a plurality of layers formed from different materials.

The film of the present invention can be processed through etching for the purpose of the formation of copper distributing wires or for other purposes. The etching may be carried out according to either the wet etching technique or the dry etching technique, but the dry etching technique is preferably used herein. Either the ammonia-derived plasma or the fluorocarbon-derived plasma may appropriately be selected and used in the dry etching process. In these plasmas, there can be used not only Ar gas, but also oxygen, nitrogen, hydrogen and/or helium gases. Moreover, the substrate may be subjected to an ashing treatment for the removal of the remaining photoresist after the completion of the foregoing etching step and further, the substrate can be washed for the purpose of the removal of any residue remaining even after the ashing.

The film of the present invention may be subjected to a treatment according to the CMP (Chemical Mechanical Polishing) for the flattening or the planarization of the copper-plated portions after the formation of the copper distributing wire pattern. The CMP slurry (a chemical liquid) usable herein may appropriately be selected from commercially available ones (such as those manufactured and sold by, for instance, FUJIMI Company, Rhodel-Nitta Company, JSR Company and Hitachi Chemical Co., Ltd.). In addition, the CMP devices usable herein include, for instance, commercially available ones (such as those manufactured and sold by, for instance, Applied Material Company, and Ebara Corporation). Further, the substrate thus treated can be washed for the removal of any residue of the slurry remaining after the CMP process.

The film of the present invention can be used in wide variety of fields and applications. For instance, the film of the present invention is suitable as an insulating film for semiconductor devices such as LSI, system LSI, DRAM, SDRAM, RDRAM and D-RDRAM; and electronic parts such as multi-layer distributing wire boards for multi-tip modules and the film can further be used as interlayer insulating film for semiconductor devices, etching stopper films, surface-protecting films, and buffer-coating films, as well as passivation films in LSI, α-beam-shielding films, solder-resist films, and liquid crystal-orientation films.

EXAMPLES

The present invention will now be described with reference to the following Examples, but the following Examples are herein given for the illustration of the present invention and the present invention is not restricted to these specific Examples at all.

Preparation Example 1

Oxidation Polymerization of 1,4,9-Triethynyl Diamantane

To a 100 ml volume three necked flask, there were added 1.0 g of 1,4,9-triethynyl diamantane and 100 ml of pyridine. To the resulting mixture, there was added 2.2 g of copper acetate and the mixture was then stirred at room temperature for 5 hours. Methanol (100 ml) was added to the reaction solution and the solid separated out of the reaction solution was removed through filtration. The resulting solid was mixed with 200 ml of toluene and then the mixture was stirred for one hour. After the removal of the insoluble matters through filtration, the resulting filtrate was washed in order with an aqueous ammonium chloride solution, a 1N aqueous nitric acid solution and distilled water. The solvent of the filtrate was removed through the distillation thereof under a reduced pressure to thus give 0.4 g of a solid having an Mw of 6000.

Preparation Example 2

Oxidation Polymerization of 1,3,5-Triethynyl Adamantane

To a 100 ml volume 3-necked flask, there were added 1.0 g of 1,3,5-triethynyl adamantane and 100 ml of pyridine. To the resulting mixture, there was added 2.6 g of copper acetate and the mixture was then stirred at room temperature for 5 hours. Then 100 ml of methanol was added to the reaction solution and the solid separated from the reaction solution was recovered through filtration. The resulting solid was mixed with 100 ml of toluene and then the mixture was stirred for one hour. After the removal of the insoluble matters through filtration, the resulting filtrate was washed in order with an aqueous ammonium chloride solution, a 1N aqueous nitric acid solution and distilled water. The solvent of the filtrate was distilled off under a reduced pressure to thus give 0.36 g of a solid having an Mw of 7000.

Preparation Example 3

Oxidation Polymerization of 1,4,6,9-Tetraethynyl Diamantane

To a 100 ml volume 3-necked flask, there were added 1.0 g of 1,4,6,9-tetra-ethynyl diamantane and 100 ml of pyridine. To the resulting mixture, there was added 2.5 g of copper acetate and the mixture was then stirred at room temperature for 5 hours. Then 100 ml of methanol was added to the reaction solution and the solid separated from the reaction solution was recovered through filtration. The resulting solid was mixed with 200 ml of toluene and then the mixture was stirred for one hour. After the removal of the insoluble matters through filtration, the resulting filtrate was washed in order with an aqueous ammonium chloride solution, a 1N aqueous nitric acid solution and distilled water. The solvent of the filtrate was distilled off under a reduced pressure to thus give 0.3 g of a solid having an Mw of 5000.

Example 1

The polymer of 1,4,9-triethynyl diamantane (Mw: 6000; 0.5 g) prepared in Preparation Example 1 was completely dissolved in 4.5 g of cyclohexanone to thus give a coating solution. This coating solution was filtered through a filter made of tetrafluoroethylene having a pore size of 0.1 µm and then applied onto the surface of a silicon wafer according to the spin coating method. This coated film was heated to 250° C. for 60 seconds on a hot plate in a nitrogen gas stream and further fired, for 60 minutes, in an oven whose atmosphere had been replaced with nitrogen gas and whose temperature was maintained at 400° C., to thus give a uniform film having a thickness of 0.5 µm and completely free of any spitting.

The relative dielectric constant (relative permittivity) (the temperature of measurement: 25° C., the same will apply to the following) of the resulting film was calculated from the capacity value as determined at 1 MHz using a mercury probe available from Four Dimensions Company and HP4285ALCR Meter available from Yokokawa Hewlett-Packard Corporation and it was found to be 2.50.

In addition, the resulting film was likewise found to be excellent in the heat resistance and mechanical strength.

Example 2

The polymer of 1,3,5-triethynyl adamantane (Mw: 7000; 0.5 g) prepared in Preparation Example 2 was completely dissolved in 4.5 g of cyclohexanone to thus give a coating solution. This coating solution was filtered through a filter made of tetrafluoroethylene having a pore size of 0.1 µm and then applied onto the surface of a silicon wafer according to the spin coating method. This coated film was heated to 250° C. for 60 seconds on a hot plate in a nitrogen gas stream and further fired, for 60 minutes, in an oven whose atmosphere had been replaced with nitrogen gas and whose temperature was maintained at 400° C., to thus give a uniform film having a thickness of 0.5 µm and completely free of any spitting.

The relative dielectric constant of the resulting film was calculated from the capacity value as determined at 1 MHz using a mercury probe available from Four Dimensions Company and HP4285ALCR Meter available from Yokokawa Hewlett-Packard Corporation and it was found to be 2.60.

In addition, the resulting film was likewise found to be excellent in the heat resistance and mechanical strength.

Example 3

The polymer of 1,4,6,9-tetra-ethynyl diamantane (Mw: 5000; 0.5 g) prepared in Preparation Example 3 was completely dissolved in 4.5 g of cyclohexanone to thus give a coating solution. This coating solution was filtered through a filter made of tetrafluoroethylene having a pore size of 0.1 µm and then applied onto the surface of a silicon wafer according to the spin coating method. This coated film was heated to 250° C. for 60 seconds on a hot plate in a nitrogen gas stream and further fired, for 60 minutes, in an oven whose atmosphere had been replaced with nitrogen gas and whose temperature was maintained at 400° C., to thus give a uniform film having a thickness of 0.5 µm and completely free of any spitting.

The relative dielectric constant of the resulting film was calculated from the capacity value as determined at 1 MHz using a mercury probe available from Four Dimensions Company and HP4285ALCR Meter available from Yokokawa Hewlett-Packard Corporation and it was found to be 2.52.

In addition, the resulting film was likewise found to be excellent in the heat resistance and mechanical strength.

Comparative Example 1

There was prepared a coating solution of 1,3,5-triethynyl benzene polymer (Mw: 3000) and a coated film was prepared using the resulting coating solution. This coated film was heated to 250° C. for 60 seconds on a hot plate in a nitrogen gas stream and further fired, for 60 minutes, in an oven whose atmosphere had been replaced with nitrogen gas and whose temperature was maintained at 400° C., to thus give a uniform film having a thickness of 0.5 μm and completely free of any spitting.

The relative dielectric constant (relative permittivity) (the temperature of measurement: 25° C., the same will apply to the following) of the resulting film was calculated from the capacity value as determined at 1 MHz using a mercury probe available from Four Dimensions Company and HP4285ALCR Meter available from Yokokawa Hewlett-Packard Corporation and it was found to be 2.77.

Comparative Example 2

A coated film of p-diethynyl benzene polymer (Mw: 6000) was heated to 250° C. for 60 seconds on a hot plate in a nitrogen gas stream and further fired, for 60 minutes, in an oven whose atmosphere had been replaced with nitrogen gas and whose temperature was maintained at 400° C., to thus give a uniform film having a thickness of 0.5 μm and completely free of any spitting.

The relative dielectric constant (relative permittivity) of the resulting film was calculated from the capacity value as determined at 1 MHz using a mercury probe available from Four Dimensions Company and HP4285ALCR Meter available from Yokokawa Hewlett-Packard Corporation and it was found to be 2.78.

Comparison of Increase of Dielectric Constants with Time Between Films

The films prepared in Examples 1 to 3 and Comparative Examples 1 and 2 were allowed to stand in the air over one week and the dielectric constants of these films were then determined. As a result, the increase in the dielectric constant was found to be 0.02 for the film of Example 1, 0.03 for the film of Example 2, and 0.03 for the film of Example 3, while the increase in the dielectric constant was found to be 0.18 for the film of Comparative Example 1 and 0.20 for the film of Comparative Example 2.

The insulating films of the present invention are excellent in the heat resistance and mechanical strength, have low dielectric constants and excellent stability of the dielectric constants with the elapse of time. On the other hand, the insulating films of Comparative Examples 1 and 2 have low heat resistance and low mechanical strength, high dielectric constants and do not show any stability of the dielectric constants with the elapse of time.

What is claimed is:

1. An insulating film for a semiconductor integrated circuit comprising a polymeric compound having, as structural units, groups each represented by the following general formula (1):

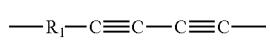     (1)

wherein $R_1$ represents a group having a cage-shaped structure.

2. The insulating film as set forth in claim 1, wherein the cage-shaped structure is a member selected from the group consisting of adamantane, bi-adamantane, diamantane, triamantane and tetramantane.

3. The insulating film as set forth in claim 2, wherein the polymeric compound is one prepared by oxidation-polymerizing a compound represented by the following general formula (2) in the presence of palladium or copper catalyst:

     (2)

wherein $R_2$ represents a group having a valency of m and a cage-shaped structure; and m is an integer ranging from 2 to 19.

4. The insulating film as set forth in claim 3, wherein the compound represented by the formula (2) is one represented by the following general formula (3), (4) or (5):

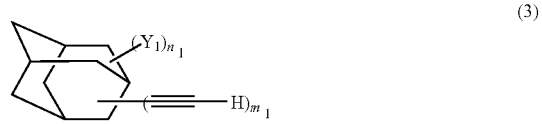     (3)

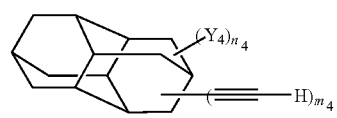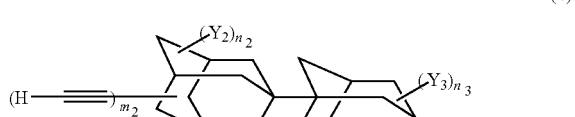     (4)

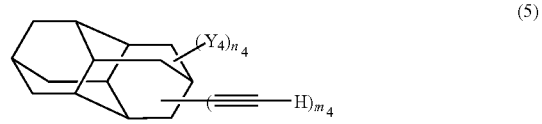     (5)

(in the general formula (3), (4) or (5), $Y_1$ to $Y_4$ each independently represent a halogen atom, an alkyl group having 1 to 10 carbon atoms, an aryl group having 6 to 20 carbon atoms, or a silyl group having 0 to 20 carbon atoms; $m_1$ is an integer ranging from 2 to 16, $n_1$ is an integer ranging from 0 to 15, $m_2$ and $m_3$ each independently represent an integer ranging from 1 to 15, $n_2$ and $n_3$ each represent an integer ranging from 0 to 14, $m_4$ is an integer ranging from 2 to 20, and $n_4$ is an integer ranging from 0 to 19).

5. A polymeric compound comprising, as structural units, groups each represented by the following general formula (1):

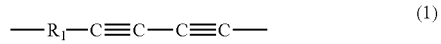     (1)

wherein $R_1$ represents a group having a cage-shaped structure.

6. The polymeric compound as set forth in claim 5, wherein it can dissolve in cyclohexanone or anisole at a temperature of 25° C. in an amount of not less than 1% by mass.

* * * * *